United States Patent
Matsuyama et al.

(10) Patent No.: US 6,865,204 B2
(45) Date of Patent: Mar. 8, 2005

(54) RIDGE WAVEGUIDE TYPE PHOTO SEMICONDUCTOR DEVICE AND METHOD FOR FABRICATING SAME

(75) Inventors: Takayuki Matsuyama, Hiratsuka (JP); Masaki Tohyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/062,747

(22) Filed: Feb. 1, 2002

(65) Prior Publication Data

US 2002/0105989 A1 Aug. 8, 2002

(30) Foreign Application Priority Data

Feb. 5, 2001 (JP) ........................................ 2001-028118

(51) Int. Cl.$^7$ ................................................ H01S 5/00
(52) U.S. Cl. ............................ 372/46; 372/43; 372/44; 372/45
(58) Field of Search ..................................... 372/43–46

(56) References Cited

U.S. PATENT DOCUMENTS

| | | | | |
|---|---|---|---|---|
| 4,833,510 A | * | 5/1989 | Nagai et al. | ................... 372/48 |
| 5,212,706 A | * | 5/1993 | Jain | .............................. 372/50 |
| 5,717,707 A | * | 2/1998 | Beernink et al. | .............. 372/46 |
| 5,770,471 A | * | 6/1998 | Nagai | ............................ 438/31 |
| 5,960,020 A | * | 9/1999 | Nagai | ............................ 372/46 |
| 6,081,541 A | * | 6/2000 | Adachi et al. | ................. 372/45 |
| 6,590,918 B1 | * | 7/2003 | Mannou et al. | ................ 372/45 |

OTHER PUBLICATIONS

U.S. Appl. No. 09/338,916, filed Jun. 23, 1999.
Masahiro Aoki et al., "InP–Based Reversed–Mesa Ridge–Waveguide Structure for High–Performance Long–Wavelength Laser Diodes", IEEE Journal of Selected Topics in Quantum Electronics, vol. 3, No. 2, Apr. 1997, pp. 672–683.

* cited by examiner

Primary Examiner—Thuy Vinh Tran
Assistant Examiner—Leith Al-Nazer
(74) Attorney, Agent, or Firm—Hogan & Hartson, LLP

(57) ABSTRACT

The ridge waveguide type photo semiconductor device includes: a first cladding layer of a first conductivity type formed on a semiconductor substrate of the first conductivity type; an active layer formed on the first cladding layer; a second cladding layer of a second conductivity type formed on the active layer; a third cladding layer of the second conductivity type formed on the second cladding layer and being worked so as to have a ridge shape; and an impurity diffusion region formed in the second cladding layer and the active layer on both sides of the ridge-shaped third cladding layer and which has a higher resistance value than that of the second cladding layer below the ridge shape.

11 Claims, 13 Drawing Sheets

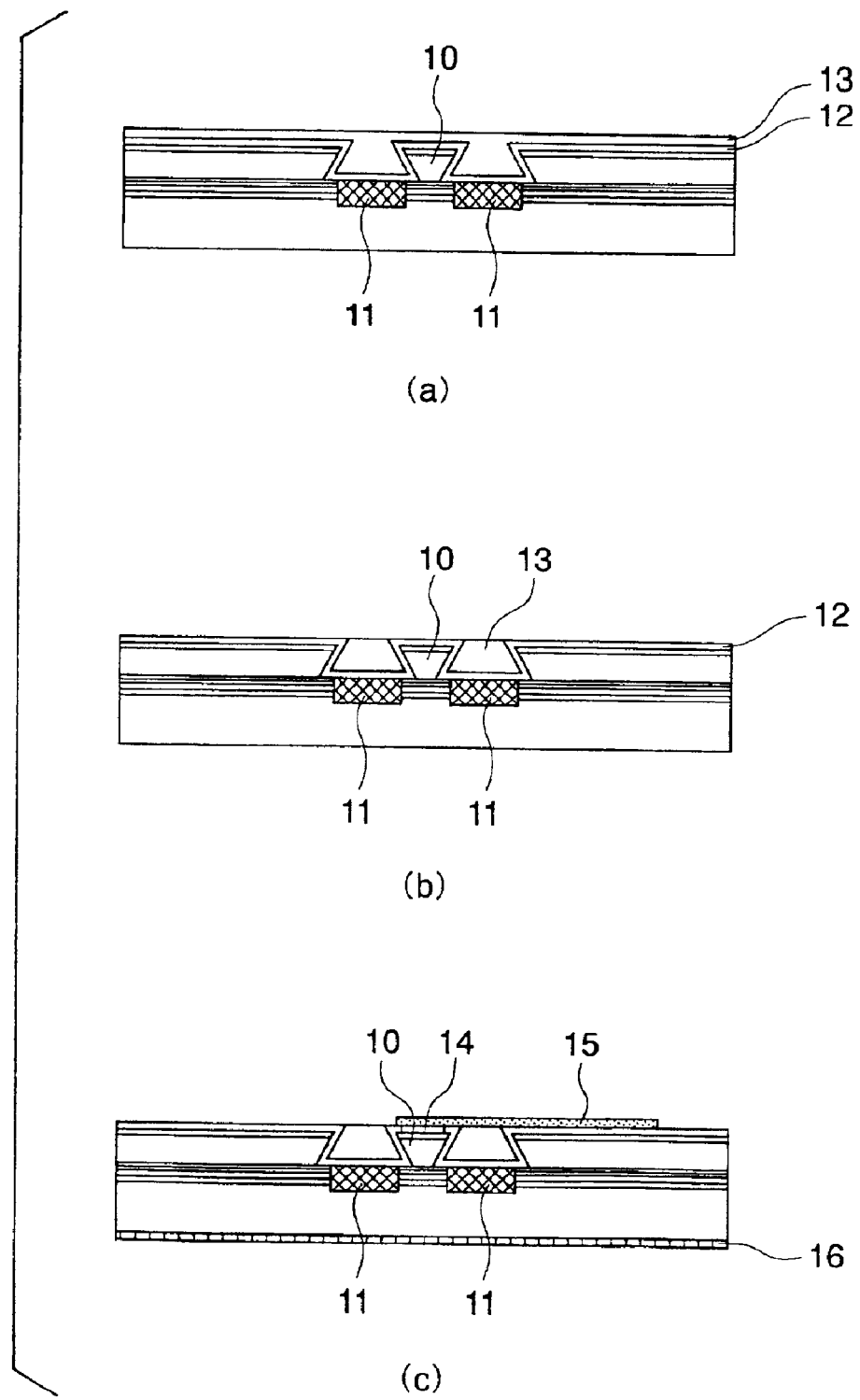
F I G. 2

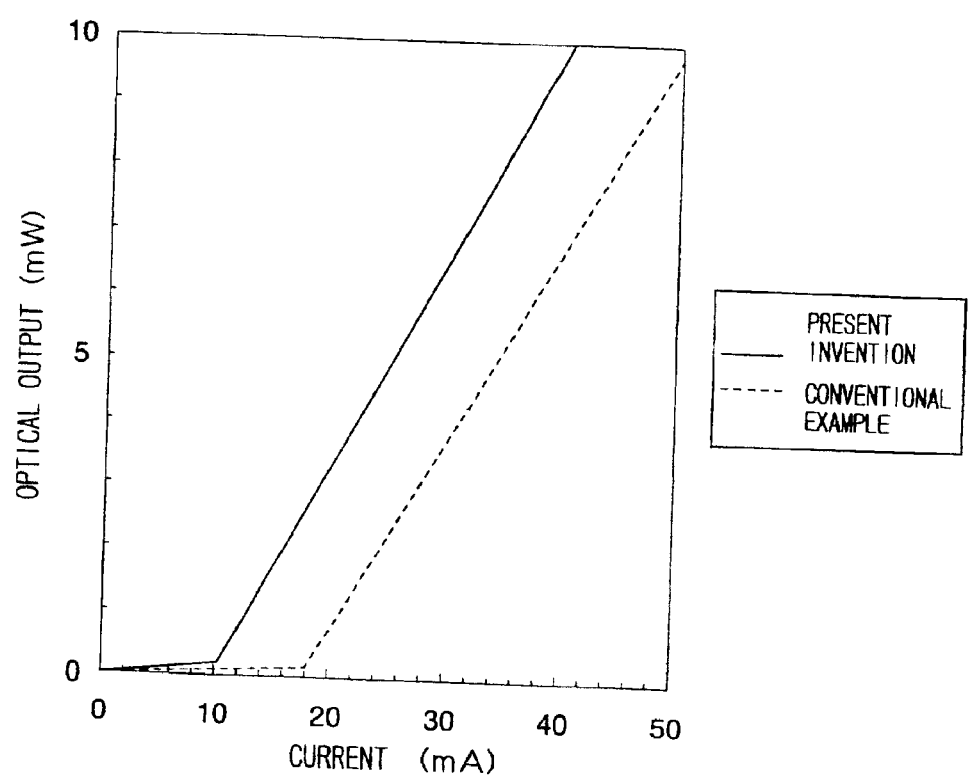
F I G. 4

| | CAPACITY | CUT-OFF FREQUENCY |
|---|---|---|
| PRESENCE OF PROTONS | 0.2pF | 15.9GHz |
| NONE OF PROTONS | 1.0pF | 3.2GHz |

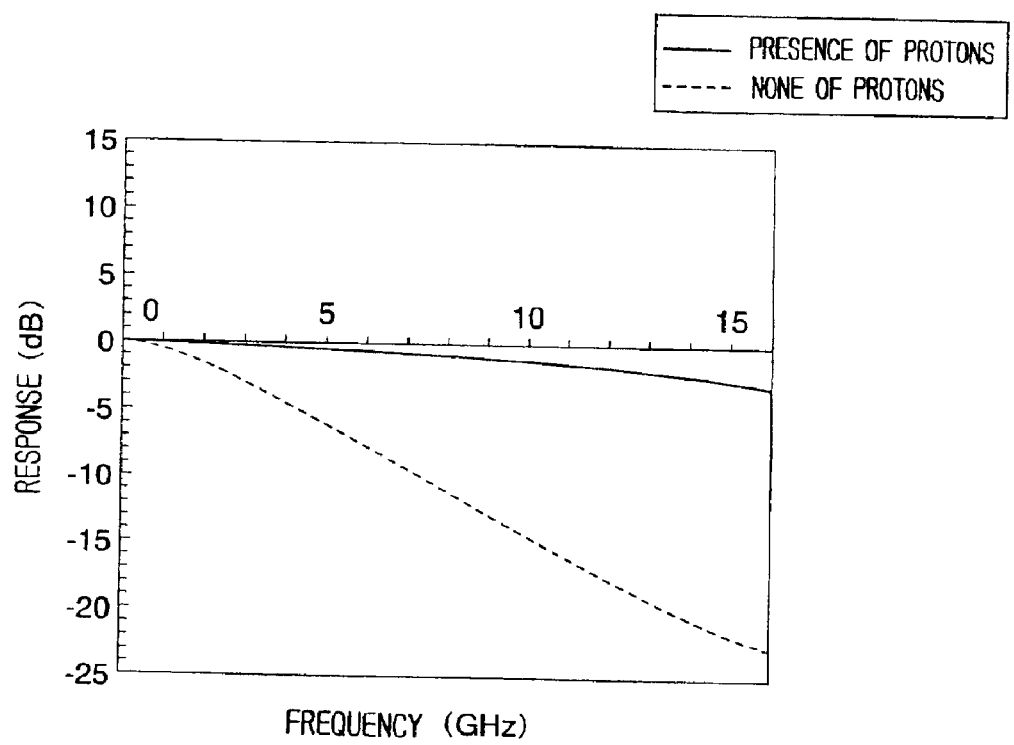
F I G. 8

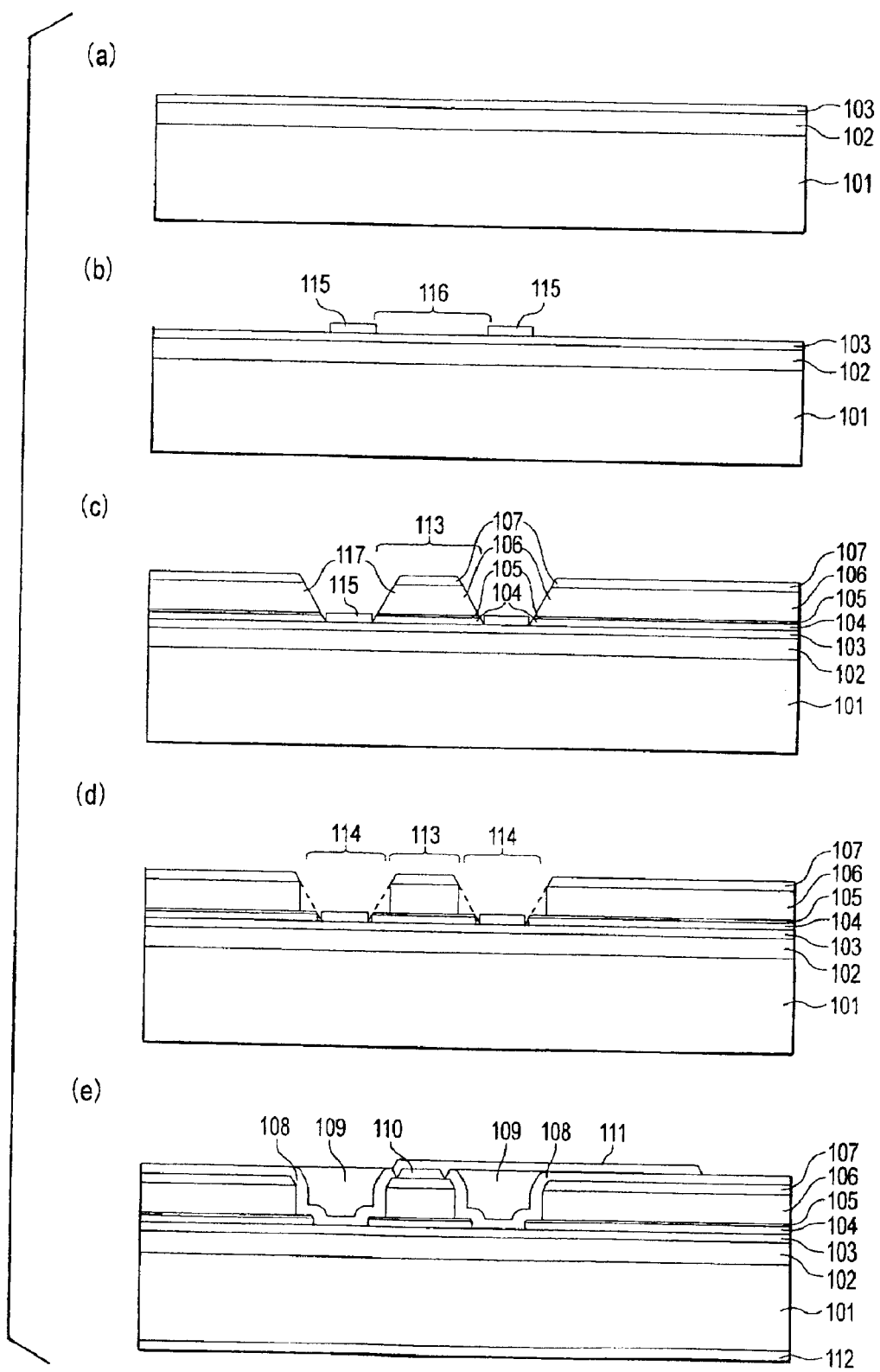
F I G. 9

US 6,865,204 B2

RIDGE WAVEGUIDE TYPE PHOTO SEMICONDUCTOR DEVICE AND METHOD FOR FABRICATING SAME

CROSS-REFERENCE TO RELATED APPLICATIONS

This application is based upon and claims the benefit of priority from the prior Japanese Patent Application No. 2001-28118, filed on Feb. 5, 2001, the entire contents of which are incorporated herein by reference.

BACKGROUND OF THE INVENTION

1. Field of The Invention

The present invention generally relates to a ridge waveguide type photo semiconductor device and a method for fabricating the same.

2. Description of Related Art

In recent years, the demand for Internet and data communication are considerably increasing. In accordance therewith, the capacities of optical communication systems are rapidly increasing. The communication capacities of trunk systems reach 10 Gb/s per channel, and multichannel transmission systems based on the wavelength division multiplex system are intended to be introduced, so that it is desired that rapidly modulatable photo semiconductor devices are provided at low costs.

Ridge waveguide type photo semiconductor devices (light modulators, semiconductor lasers, etc.) do not have any semiconductor buried layers which are provided in most of refractive index waveguide structures and which function as current blocking layers. Therefore, the ridge waveguide type photo semiconductor devices have an advantage in that current leakage and reverse junction breakdown do not occur in buried layers, and an advantage in that the devices do not have parasitic capacities caused by buried layer junctions, so that the parasitic capacities of the whole devices can be decreased. Moreover, processes for fabricating ridge waveguide type photo semiconductor devices have excellent cost reducing effects and mass production effects since only one or two crystal growths have only to be carried out. Thus, ridge waveguide type photo semiconductor devices have excellent advantages. On the other hand, there is a problem in that it is difficult to carry out processes for fabricating ridge waveguide type photo semiconductor devices. As a typical example of a ridge waveguide type photo semiconductor device, a conventional device structure of a ridge waveguide type semiconductor laser (which will be also hereinafter referred to as a RWG-LD) will be described below.

FIG. 12 shows the structure of a conventional Fabry-Perot type RWG-LD device. On a substrate 80 of n-InP, a cladding layer 81 of n-InP in which S is doped and which has a thickness of 2 μm and a carrier density of $1 \times 10^{18}$ cm$^{-3}$, an active layer 82 which has a thickness of 1.3 μm and a multiple quantum well structure (which will be also hereinafter referred to as MQW), a cladding layer 83 of p-InP in which Zn is doped and which has a thickness of 2 μm and a carrier density of $1 \times 10^{18}$ cm$^{-3}$, and a contact layer 84 of p-InGaAs in which Zn is doped and which has a thickness of 0.3 μm and a carrier density $8 \times 10^{18}$ cm$^{-3}$, are sequentially crystal-grown by the MOCVD (Metal Organic Chemical Vapor Deposition) method. Subsequently, after an SiO$_2$ film (not shown) is formed on the whole surface of the wafer, a resist pattern (not shown) having a width of 5 μm and two stripe-like windows is formed on the wafer by the lithography technique, and the resist pattern is used as a mask for etching the SiO$_2$ film so that the film has a stripe shape. After the resist pattern is removed, the SiO$_2$ film is used as a mask for sequentially etching the p-InGaAs contact layer 84 and the p-InP cladding layer 83 with a sulfuric acid containing etchant and a hydrogen bromide containing etchant, respectively. At this time, the etching is stopped directly above the MQW active layer 82, and a reverse mesa-shaped ridge 86 is formed. Thereafter, the SiO$_2$ film is removed.

Then, after an SiO$_2$ film 85 is formed on the whole surface of the wafer, a resin 87 is applied thereon and cured. Thereafter, the head of the ridge portion 86 is exposed by the reactive ion etching (which will be also hereinafter referred to as RIE). By this operation, the resin 87 can be filled in grooves on the both sides of the ridge 86. Subsequently, a resist pattern (not shown) having a stripe-like window having a width of 2 μm is formed on the ridge 86.

Then, after a TiPt film 88 to be a p-type electrode is deposited on the whole surface of the wafer, a stripe-like TiPt film 88 is formed on a portion of the ridge 86 corresponding to the window by the lift-off method. After sintering is carried out at 450° C., a bonding pad 89 of Ti/Pt/Au is formed by the vapor deposition method and the lift-off method.

Then, the n-InP substrate 80 is polished so as to have a thickness of 100 μm, and an AuGe/Ni/Au film 90 to be an n-type electrode is deposited on the reverse surface of the wafer to be sintered. The wafer is cut out so as to have a resonator length of 300 μm and a chip width of 300 μm, so that a device is completed.

FIG. 13 shows an equivalent circuit of an RWC-LD thus constructed. In FIG. 13, a current is injected into the active layer 93 via a bulk resistance 92 of the ridge-shaped p-InP cladding layer 91, and a current also flows through a diffusion resistance 94 in lateral directions. The current flowing through the diffusion resistance 94 becomes a reactive current (leakage current), and does not contribute to laser oscillation. In addition, a parasitic capacity 95 of a pn junction exists in lateral directions, so that there is a problem in that the capacity of the device increases if the diffusion resistance 94 is low.

FIG. 14 shows the construction of another conventional ridge waveguide type semiconductor laser. FIG. 14 is a sectional view perpendicular to optical waveguide directions. In FIG. 14, reference number 151 denotes an n-type InP substrate, 152 denoting an n-type InP cladding layer in which S is doped and which has a thickness of 2.0 μm and a carrier density of $1 \times 10^{18}$ cm$^{-3}$, 153 denoting an active layer having a multiple quantum well structure of InGaAsP/InGaAsP, 154 denoting a p-type InP cladding layer in which Zn is doped and which has a thickness of 0.2 μm and a carrier density of $5 \times 10^{17}$ cm$^{-3}$, 155 denoting a p-type InGaAsP etch stop layer in which Zn is doped and which has a band gap wavelength of 1.2 μm, a thickness of 0.02 μm and a carrier density of $1 \times 10^{18}$ cm$^{-3}$, 156 denoting a p-type InP over cladding layer in which Zn is doped and which has a thickness of 1.5 μm and a carrier density of $1 \times 10^{18}$ cm$^{-3}$, 157 denoting a p-type InGaAs contact layer in which Z is doped and which has a thickness of 0.3 μm and a carrier density of $8 \times 10^{18}$ cm$^{-3}$, 158 denoting an SiO$_2$ film, 159 denoting a resin, 160 denoting a p-side ohmic electrode of Pt/Ti/Pt, 161 denoting a wire/bonding pad of Ti/Pt/Au, and 162 denoting an n-side ohmic electrode of AuGe/Ni/Au.

In this conventional example, since the p-type InP cladding layer 154 is formed on the whole top face of the active layer 153, a current injected from the p-type InP over cladding layer 156 diffuses to the outside of a ridge portion 163 via the p-type InP cladding layer 154. As a result, the p-type InP overlap cladding layer 156 picks up the junction capacity outside of the ridge portion 163 although it is formed so as to have a ridge shape, so that it is difficult to reduce the capacity of the device.

FIG. 15 is a sectional view of another ridge waveguide type semiconductor laser. In this figure, the same reference numbers as those in FIG. 14 are given to the same portions as those in FIG. 14, and the descriptions thereof are omitted. In this conventions example, only the ridge-shaped p-type over cladding layer 156 is stacked on the active layer 153, and the diffusion of current to the outside of the ridge portion 163 hardly occurs. Therefore, it is possible to sufficiently reduce the capacity of the device, and it is possible to carry out a rapid modulation of 10 Gb/s. However, there is a problem in that the light confining effect to the active layer is inferior to that of the ridge waveguide type semiconductor laser shown in FIG. 14.

Ridge waveguide structures obtain the light confining effect in vertical directions by sandwiching a light waveguide layer (the active layer 153 in the conventional example shown in FIG. 15) between cladding layers having a low refractive index (the n-type InP cladding layer 152 and p-type InP over cladding layer 156 in this conventional example). On the other hand, the light confining effect in lateral directions is realized by forming an one-side ridge-shaped cladding layer (the p-type InP over cladding layer 156 in the conventional example shown in FIG. 15). In the conventional example shown in FIG. 15, only the n-type InP cladding layer 152 exists on one side of the active layer 153 in regions other than the ridge portion, and the opposite side directly contacts the $SiO_2$ film 158. Since the dielectric of the $SiO_2$ film or the like has a far lower refractive index than that of semiconductors, the photoelectric field distribution in the active layer 153 rapidly attenuates on the side of the $SiO_2$ film 158, so that the light confining effect to the active layer 153 in vertical directions is low.

In the conventional example shown in FIG. 14, the thin p-type InP cladding layer 154 is formed on the whole top face of the active layer 153 in order to obtain the light confining effect in vertical directions. The thickness of the p-type InP cladding layer 154 is set to be 0.2 $\mu$m so as not to prevent the light confining effect in lateral directions and so as to ensure the light confining effect in vertical directions.

Thus, in order to realize both of the reduction of capacity of the device and the light confinement to the active layer, it is required to further devise the structure of the cross section. In FIG. 14, if the carrier density of the p-type InP cladding layer 154 is decreased or if the p-type InP cladding layer 154 is an undoped layer, it is possible to suppress the diffusion of current to the outside of the ridge portion 163 while holding the light confining effect. However, this can not be an actual solution since the current injection efficiency to the active layer 153 immediately below the ridge portion 163 is also deteriorated.

On the other hand, as a conventional structure realizing both of the reduction of capacity of the device and the light confinement to the active layer, there is a ridge waveguide type semiconductor laser shown in FIG. 16. In this figure, the same reference numbers as those in FIG. 14 are given to the same portions as those in FIG. 14, and the descriptions thereof are omitted. In this conventional example, a p-type InP cladding layer 154 is formed on both sides of the p-type over cladding layer 156 so as to be slightly wider. The width of the p-type InP cladding layer 154 may be formed so as to be wide to an extent that it is required to ensure the light confining effect. In addition, the junction capacity contributing to the capacity of the device is also defined by the width of the p-type cladding layer 154, and can be reduced.

Referring to FIGS. 16(a) through 16(e), a process for fabricating a ridge waveguide type semiconductor laser shown in FIG. 16(f) will be described below. First, on a n-type InP substrate 151, an n-type InP cladding layer (thickness 2.0 $\mu$m, S dope, $1 \times 10^{18}$ cm$^{-3}$), an active layer 153 having an InGaAsP/InGaAsP multiple quantum well structure, a p-type InP cladding 154 (thickness 0.2 $\mu$m, Zn dope, carrier density $5 \times 10^{17}$ cm$^{-3}$), a p-type InGaAsP etch stop layer 155 (band gap wavelength 1.2 $\mu$m, thickness 0.02 $\mu$m, Zn dope, carrier density $1 \times 10^{18}$ cm$^{-3}$), a p-type InP over cladding layer 156 (thickness 1.5 $\mu$m, Zn dope, carrier density $1 \times 10^{18}$ cm$^{-3}$), and a p-type InGaAs contact layer 157 (thickness 0.3 $\mu$m, Zn dope, carrier density $8 \times 10^{18}$ cm$^{-3}$) are sequentially stacked (see FIG. 16(a)).

Thereafter, a stripe-like $SiO_2$ mask 165 is formed on the p-type InGaAs contact layer 157. This is used as a mask for etching the p-type InGaAs contact layer 157 with a sulfuric acid containing etchant (see FIG. 16(b)). Then, the p-type InGaAs contact layer 157 is used as a mask for etching the p-type InP over cladding layer 156 with a hydrochloric acid containing etchant (see FIG. 16(c)). Moreover, the p-type InP over cladding layer 156 is used as a mask for etching the p-type InGaAsP etch stop layer 155 with a sulfuric acid etchant (see FIG. 16(d)). At this time, the p-type InGaAs contact layer 157 is simultaneously side-etched. However, since the etching rate of the p-type InGaAs contact layer 157 is higher than that of the p-type InGaAsP etch stop layer 155, the width of the p-type InGaAs contact layer 157 after the etching is smaller than that of the p-type InGaAsP etch stop layer 155.

Then, the p-type InGaAs contact layer 157 is used as a mask for etching the p-type InP over cladding layer 156 with a hydrochloric acid containing etchant, and simultaneously, the p-type InGaAsP etch stop layer 155 is used as a mask for etching the p-type InP cladding layer 154 with a hydrochloric acid containing etchant (see FIG. 16(e)). Subsequently, after the $SiO_2$ mask 165 is etched, an $SiO_2$ film is formed on the whole surface of the device. Thereafter, a resin 159 is filled in grooves 164 on both sides of the ridge portion 163 to be flattened. Moreover, after a p-side ohmic electrode 160 of Pt/Ti/Pt is formed on the p-type InGaAs contact layer 157, a wire/bonding pad 161 of Ti/Pt/Au is formed. Finally, an n-side ohmic electrode 162 of AuGe/Ni/Au is formed on the reverse surface of the n-type InP substrate 151, so that the ridge waveguide type semiconductor laser of FIG. 16(f) is completed.

As described above, in the fabricating process shown in FIG. 16, the device is formed by alternately repeating the selective etching of the InP layer and the selective etching of the InGaAs layer and InGaAsP layer. At the step of using the p-type InGaAs layer contact layer 157 and the p-type InGaAsP etch stop layer 155 as masks for etching the p-type InP over cladding layer 156 and the p-type InP cladding layer 154, no side etching occurs. However, at the step of etching the p-type InGaAs layer contact layer 157 and the p-type InGaAsP etch stop layer 155 with the sulfuric acid containing etchant, the side etching occurs. In addition, the p-type InP over cladding layer 156 and the p-type InP cladding layer 154 are formed so as to have different widths by utilizing the difference between the etching rates of both layers. As a result, necessarily, the process considerably lacks the controllability of width and repeatability. The amount of side etching does not only have a large wafer inplane distribution, but it is also often asymmetric with respect to the ridge portion 163. In such cases, the p-type InP over cladding layer 156 is formed so that its position with respect to the p-type InP cladding layer 154 is shifted.

Since the photoelectric field is distributed so as to extend outside of the ridge portion 163 by about 1 μm on each side, if only the width of the p-type InP cladding layer 154 is increased by about 1 μm to each of the right and left of the p-type InP over cladding layer 156, the light confining effect in vertical directions is sufficiently ensured. Even if the width of the p-type InP cladding layer 154 is further increased, the capacity of the device only uselessly increases.

Thus, in the conventional ridge waveguide type semiconductor laser fabricating method utilizing the side etching, it is very difficult to obtain a desired ridge shape with a required precision.

SUMMARY OF THE INVENTION

A ridge waveguide type photo semiconductor device according to a first aspect of the present invention comprises: a first cladding layer of a first conductivity type which is formed on a semiconductor substrate of the first conductivity type; an active layer which is formed on the first cladding layer; a second cladding layer of a second conductivity type which is formed on the active layer; a third cladding layer of the second conductivity type which is formed on the second cladding layer and which is worked so as to have a ridge shape; and an impurity diffusion region which is formed in the second cladding layer and the active layer on both sides of the ridge-shaped third cladding layer and which has a higher resistance value than that of the second cladding layer below the ridge shape.

According to a second aspect of the present invention, there is provided a method for fabricating a ridge waveguide type photo semiconductor device, the method comprising: sequentially crystal-growing and forming a first cladding layer of a first conductivity type, an active layer, a second cladding layer of a second conductivity type, a third cladding layer of the second conductivity type, and a contact layer, on a semiconductor substrate of the first conductivity type; forming a mask having a stripe shape on the contact layer; etching the contact layer and the third cladding layer with the mask so that the contact layer and the third cladding layer have a reverse mesa-shaped cross section, to form a ridge portion; and subsequently implanting proton ions into the semiconductor substrate.

According to a third aspect of the present invention, there is provided a method for fabricating a ridge waveguide type photo semiconductor device, the method comprising growing at least an optical waveguide layer on a semiconductor substrate of a first conductivity type; forming a growth inhibiting mask having a stripe-shaped opening portion on the optical waveguide layer; sequentially growing a ridge portion on the opening portion, the ridge portion comprising at least a cladding layer of a second conductivity type, an etch stop layer, an over cladding layer of the second conductivity type, and a contact layer of the second conductivity type; and etching the over cladding layer with the contact layer as a mask for.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIGS. 2(a) through 2(c) are sectional views showing a process for fabricating a ridge waveguide type semiconductor laser according to the first embodiment of the present invention;

FIG. 4 is a graph showing the relationship between injected current and optical output in the first embodiment and a conventional ridge waveguide type semiconductor laser;

FIG. 8 is a graph showing frequency characteristics in the second embodiment and a conventional ridge waveguide type electric field absorbing light modulator;

FIGS. 9(a) through 9(e) are sectional views showing the third embodiment of a method for fabricating a ridge waveguide type semiconductor laser according to the present invention;

DESCRIPTION OF THE EMBODIMENTS

Referring now to the accompanying drawings, the embodiments of the present invention will be described below.

(First Embodiment)

Figure 1:
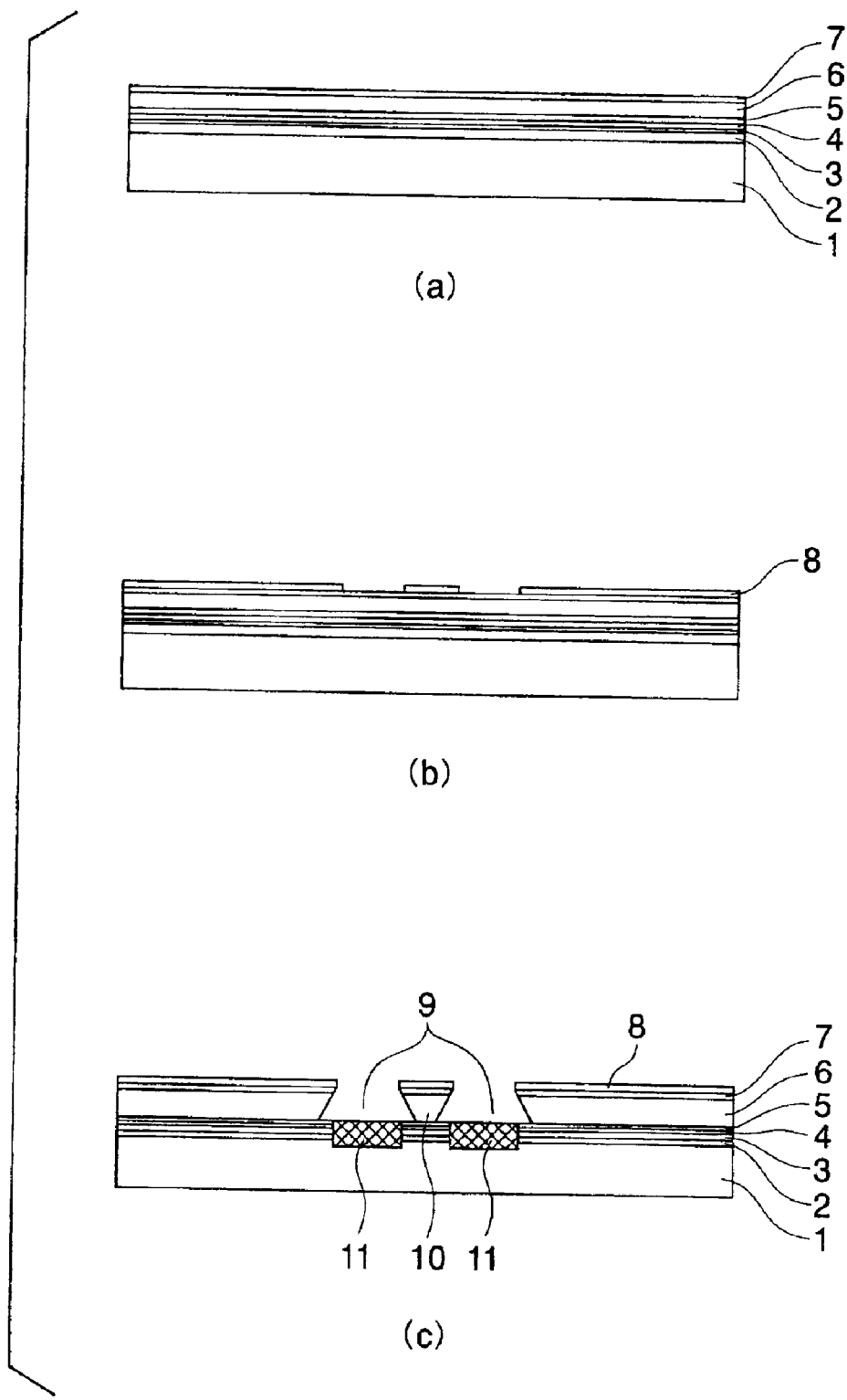
FIGS. 1(a) through 1(c) are sectional views showing a process for fabricating a ridge waveguide type semiconductor laser according to the first embodiment of the present invention.

Referring to FIGS. 1 through 5, the first embodiment of the present invention will be described below. In this embodiment, there is provided a ridge waveguide type semiconductor laser (which will be also hereinafter referred to as RWG-LD), the construction of which is shown in FIG. 2(c) and the fabricating process of which is shown in FIGS. 1 and 2.

First, on a substrate 1 of n-InP, a cladding layer 2 of n-InP in which S is doped and which has a thickness of 2 μm and a carrier density of $1 \times 10^{18}$ $cm^{-3}$, an active layer 3 which has a thickness of 1.55 μm and a multiple quantum well structure (which will be also hereinafter referred to as MQW), a cladding layer 4 of p-InP in which Zn is doped and which has a thickness of 0.2 μm and a carrier density of $5 \times 10^{17}$ $cm^{-3}$, an etch stop layer 5 of p-InGaAsP in which Zn is doped and which has a thickness of 0.05 μm and a carrier density of $5 \times 10^{17}$ $cm^{-3}$, a cladding layer 6 of p-InP in which Zn is doped and which has a thickness of 2.0 μm and a carrier density of $1 \times 10^{18}$ $cm^{-3}$, and a contact layer 7 of p-InGaAs in which Zn is doped and which has a thickness of 0.3 μm and a carrier density $8 \times 10^{18}$ $cm^{-3}$, are sequentially crystal-grown by the MOCVD (Metal Organic Chemical Vapor Deposition) method (see FIG. 1(a)).

Then, after an $SiO_2$ film is formed on the whole surface of the wafer, the $SiO_2$ film is patterned by the photolithography technique to form a mask 8 of the $Sio_2$ film (see FIG. 1(b)).

Subsequently, the mask 8 is used for sequentially etching the p-InGaAs contact layer 7 and the p-InP cladding layer 6 with a sulfuric acid containing etchant and a hydrogen bromide containing etchant, respectively (see FIG. 1(c)). At this time, the etching is stopped directly above the p-InGaAsP etch stop layer 5 to form grooves 9 and a reverse mesa-shaped ridge 10 in an unetched region between the grooves 9 (see FIG. 1(c)). Thereafter, while the mask 8 remains, proton ions are implanted into the whole surface of the wafer (FIG. 1(c)). Implantation conditions at this time are set so as to include a dose of $3 \times 10^{14}$ $cm^{-2}$ and an accelerating voltage of 60 KeV. On these conditions, a proton ion implanted region 11 is selectively formed only on the bottom of the grooves 9 at a depth of up to about 0.3 μm (see FIG. 1(c))

Then, the mask 8 is removed, and an $SiO_2$ film 12 is formed on the whole surface of the wafer. Thereafter, a resin 13 is applied thereon and cured (see FIG. 2(a)). Subsequently, the resin is sequentially etched from the surface by the reactive ion etching (RIE). Thus, the resin 13 is filled only in the grooves 9, i.e., the $SiO_2$ film 12 above the ridge 10 is exposed (see FIG. 2(b)).

Then, a p-type electrode 14, a bonding pad 15 and an n-type electrode 16 are formed on the ridge 10, and thereafter, the device is worked so as to have, e.g., a width of 300 μm and a length of 300 μm, to be completed (see FIG. 2(c)).

Figure 3:
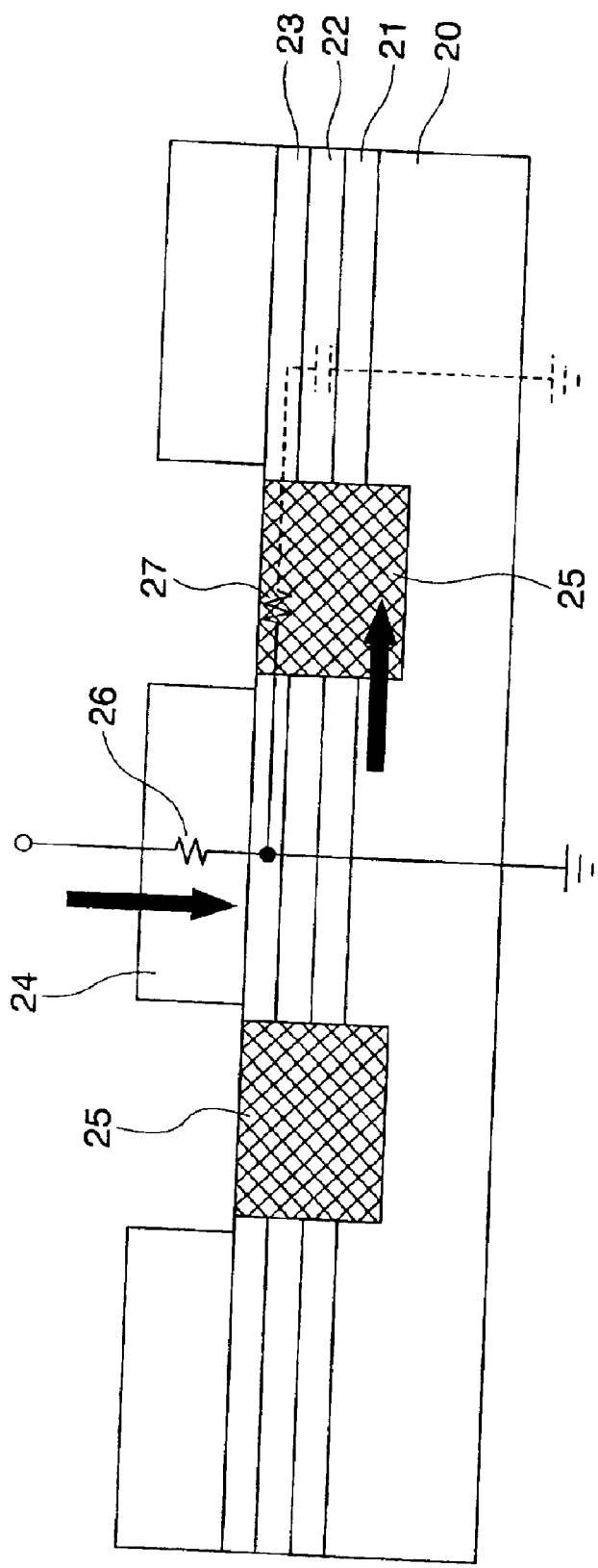
FIG. 3 is an equivalent circuit diagram of the ridge waveguide type semiconductor laser in the first embodiment.
Figure 5:
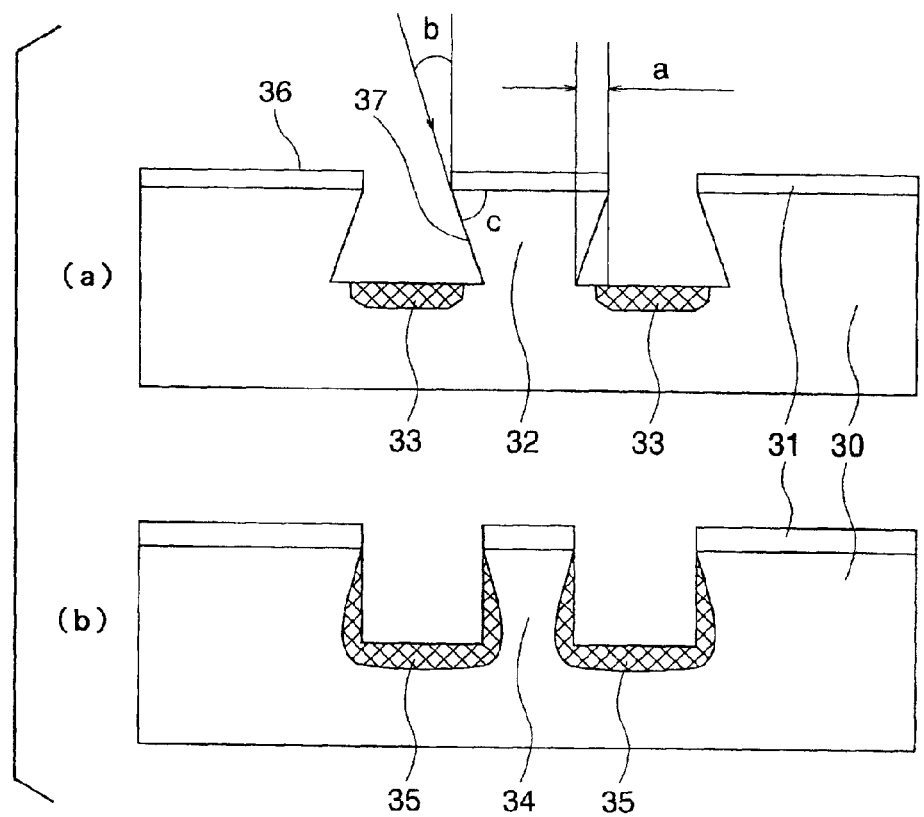
FIGS. 5(a) and 5(b) are sectional views showing the relationship between a ridge shape and a proton implantation when a ridge waveguide type semiconductor device is formed.

FIG. 3 shows an equivalent circuit of the RWG-LD in this embodiment thus formed. In this figure, reference number 20 denotes a substrate, 21 denoting an n-InP cladding layer, 22 denoting an active layer, 23 denoting a p-InP cladding layer, 24 denoting a p-InP cladding layer formed so as to have a ridge shape, and 25 denoting a proton implanted region. A current injected into the semiconductor laser is injected into the active layer via a bulk resistance 26. At this time, since a diffusion resistance 27 based on proton implantation is a large value of hundreds kΩ, the current (leakage current) flowing through the diffusion resistance 27 decreases to an extent that it can be ignored. Therefore, the capacity shown by the dotted line in FIG. 3 can also be ignored.

FIG. 4 shows the relationship between injected current and optical output in the RWG-LD in this embodiment and in a conventional RWG-LD. As can be seen from FIG. 4, the threshold current in the conventional RWG-LD was 18 mA, whereas the threshold current in the RWG-LD in this embodiment was 10 mA, so that the threshold current could be lower than that in the conventional RWG-LD by 8 mA.

As described above, the ridge waveguide type semiconductor laser in this embodiment can prevent the occurrence of the leak current and can decrease the threshold current as compared with that in the conventional laser.

Referring to FIGS. 5(a) and 5(b), the relationship between a ridge shape and a proton ion implanted region during the formation of a ridge waveguide type photo semiconductor device (e.g., a ridge waveguide type semiconductor laser) will be described below. FIGS. 5(a) and 5(b) are sectional views showing the state of the device after proton ions are implanted. In FIGS. 5(a) and 5(b), reference number 30 denotes a light emitting element substrate, and 31 denotes an $SiO_2$ film which will be an implantation mask. In FIG. 5(a), a ridge 32 has a reverse mesa shape according to an embodiment of the present invention, so that a proton implanted portion 33 is selectively formed only on the bottom of grooves. On the other hand, in the case of FIG. 5(b), a ridge 34 does not have a reverse mesa shape, so that a proton implanted portion 35 is formed on the side of the ridge and in an active layer, not only on the bottom of grooves.

In the reverse mesa-shaped ridge structure in this embodiment, the proton implanted region 33 can be implanted only into a required portion by self-alignment. As shown in FIG. 5(a), a distance a between the ion implanted portion and the root of the ridge can be controlled by setting an appropriate ion implanting angle b. If protons are implanted close to the active layer, the capacity of the device can be decreased. For example, in FIG. 5(a), the crystal plane orientation of a principal plane 36 is (100), and the plane direction of a side face 37 of the reverse mesa-shaped ridge 32 is (111)A. In this case, the angle C of a corner portion of the ridge 32 is 54°. For that reason, the implanting angle b must be 36° or less. Because ions are implanted from the side face 37 of the ridge 32 to form an implanted region in the side portion 37 of the ridge 32 similar to the case of FIG. 5(b) if implantation is carried out at an angle exceeding 36°.

(Second Embodiment)

Figure 6:
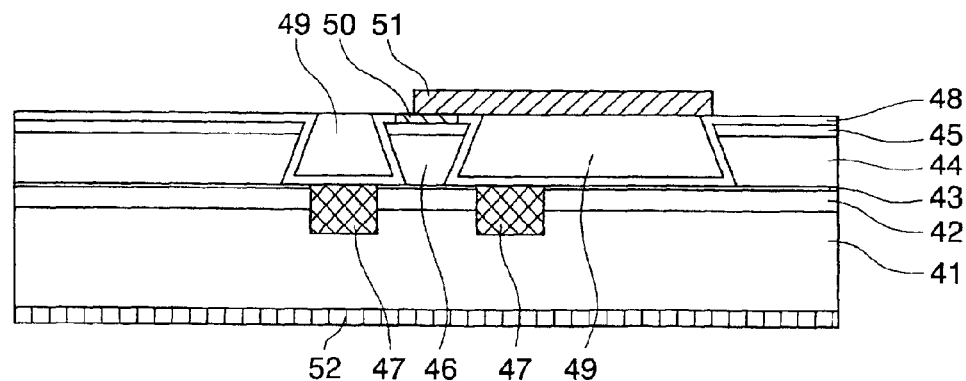
FIG. 6 is a sectional view showing the construction of the second embodiment of a ridge waveguide type electric field absorbing light modulator according to the present invention.

Referring to FIGS. 6 through 8, the second embodiment of the present invention will be described below. In this embodiment, there is provided a ridge waveguide type electric field absorbing light modulator (which will be also hereinafter referred to as RWG-EA), the construction of which is shown in FIG. 6.

On a substrate 41 of n-InP, a cladding layer 42 of n-InP in which S is doped and which has a thickness of 2 μm and a carrier density of $1 \times 10^{18}$ $cm^{-3}$, an electric field absorbing layer 43 of MQW which has a thickness of 1.5 μm, a cladding layer 44 of p-InP in which Zn is doped and which has a thickness of 2.0 μm and a carrier density of $1 \times 10^{18}$ $cm^{-3}$, and a contact layer 45 of p-InGaAs in which Zn is doped and which has a thickness of 0.3 μm and a carrier density $8 \times 10^{18}$ $cm^{-3}$, are sequentially crystal-grown by the MOCVD method. Thereafter, a mesa portion 46 is formed to form grooves, and protons are implanted into the grooves to form a proton implanted region 47. Subsequently, an $SiO_2$ film 48 is formed on the whole surface. The grooves are filled with a resin 49. At this time, a region for forming a bonding pad 51 which will be described later is preferably filled with a resin. Because the parasitic capacity of the bonding pad 51 can be decreased. Thereafter, a p-type electrode 50, a bonding pad 51 and an n-type electrode 52 are formed, and the device is worked so as to have a width of 300 µm and a length of 300 µm to be completed.

Figures 7A, 7B:
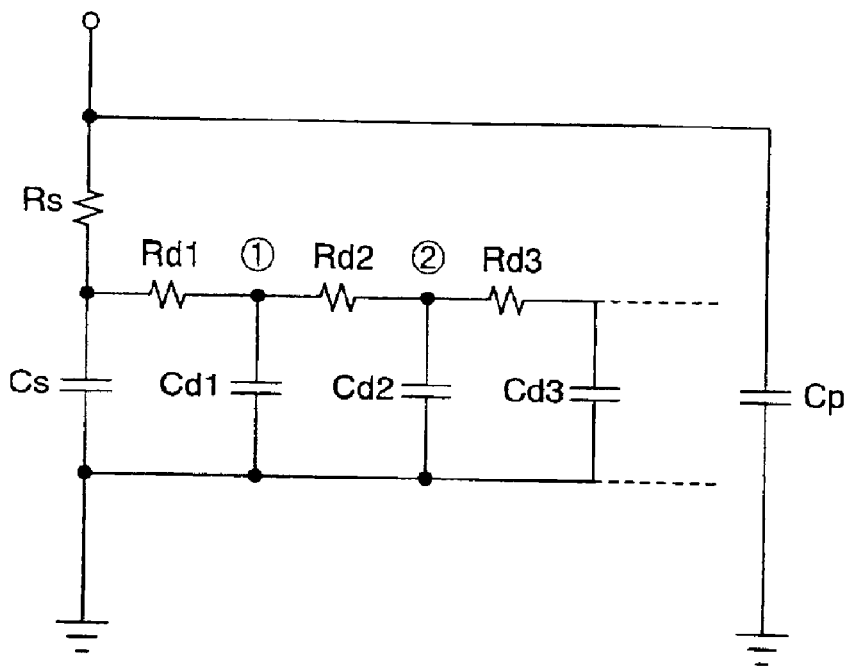
FIG. 7A is an equivalent circuit diagram in the second embodiment.
FIG. 7B is a table showing capacities and cut-off frequencies of a ridge waveguide type electric field light modulator when proton implantation is carried out and is not carried out.

FIG. 7A shows an equivalent circuit of the RWG-EA, and FIG. 7B shows capacities and cut-off frequencies of the RWG-EA device when proton implantation is carried out and is not carried out. In FIG. 7A, Rd1 through Rd3 denote a diffusion resistance in lateral directions, Cd1 through Cd3 denoting a parasitic capacity distributed in lateral directions, Cs denoting an active layer stripe capacity, and Cp denoting a bonding pad capacity. A voltage applied to the EA device is applied to the diffusion resistance Rd1 via a bulk resistance Rs. Moreover, a voltage is applied to the parasitic capacities Cd1, Cd2 and Cd3 distributed in lateral directions, via the diffusion resistance Rd1, Rd2 and Rd3. At this time, a voltage drop occurs in the diffusion resistance, and the voltage applied to the parasitic capacity decreases as the voltage drop expands in lateral directions. The diffusion resistance before proton implantation is determined by the carrier density, thickness and length of the p-InP cladding layer and so forth. In this embodiment, the diffusion resistance is 48Ω per a lateral length of 1 µm. The diffusion capacity Cd in lateral directions, and the capacity C of the whole device are as follows.

$$Cd = Cd1 + Cd2 + Cd3 + \ldots$$

$$= Cd + Cp + Cs$$

If no proton was implanted as the conventional case, Cd=0.8 pF, Cp=0.1 pF and Cs=0.1 pF. On the other hand, in this embodiment in which the proton implanted region is formed, the diffusion resistance is 100 kΩ which is extraordinarily large, and it is possible to ignore Cd, so that it is possible to prevent the occurrence of leakage current. In this embodiment, the capacity C of the device was 0.2 pF.

FIG. 8 is a graph showing frequency characteristics of the RWG-EA device in this embodiment and the conventional RWG-EA device. The cut-off frequency of the device in this embodiment in which protons were implanted was 15.9 GHz, and the cut-off frequency of the conventional device was 3.2 GHz. The conventional EA device having the RWG structure could only realize an operation of up to 2.5 Gb/s. However, if the device in this embodiment is used, the device can be applied to a light source for a large-capacity optical communication system of 10 Gb/s or more.

As described above, according to the second embodiment, it is possible to prevent the occurrence of leakage current.

While the ridge waveguide type semiconductor laser device has been provided in the first embodiment and while the electric field absorbing light modulator has been provided in the second embodiment, the present invention may be applied to a light modulator integrated light source in which both are integrated.

(Third Embodiment)

Referring to FIG. 9, the third embodiment of the present invention will be described below. In this embodiment, a method for fabricating a ridge waveguide type semiconductor laser is provided, and fabricating steps thereof are shown in FIG. 9.

First, on a substrate 101 of n-type InP having a principal plane of (100) plane, a cladding layer 102 of n-type InP in which S is doped and which has a thickness of 2.0 µm and a carrier density of $1 \times 10^{18}$ cm$^{-3}$, and an active layer 103 of InGaAsP/InGaAsP having the multiple quantum well structure are sequentially stacked (see FIG. 9(a)).

Then, on the multiple quantum well active layer 103, an $SiO_2$ growth inhibiting mask 115 having a stripe-shaped opening portion 116 (width 5.0 µm) is formed in the <110> direction (see FIG. 9(b)).

Moreover, a p-type InP cladding layer 104 in which Zn is doped and which has a thickness of 0.2 µm and a carrier density of $5 \times 10^{17}$ cm$^{-3}$, a p-type InGaAsP etch stop layer 105 in which Zn is doped and which has a band gap wavelength of 1.2 µm, a thickness of 0.02 µm and a carrier density of $1 \times 10^{18}$ cm$^{-3}$, a p-type InP over cladding layer 106 in which Zn is doped and which has a thickness of 1.4 µm and a carrier density of $1 \times 10^{18}$ cm$^{-3}$, and a p-type InGaAs contact layer 107 in which Zn is doped and which has a thickness of 0.3 µm and a carrier density $8 \times 10^{18}$ cm$^{-3}$, are selectively grown on the opening portion 116 by the metal organic chemical vapor deposition(MOCVD) method (see FIG. 9(c)). At this time, the side face of the selective growth layer is formed from the (111)B crystal plane 117, and the shape of the cross section of the ridge portion 113 is trapezoid.

Then, the p-type InGaAs contact layer 107 is used as a mask for etching the p-type InP over cladding layer 106 with a hydrochloric acid containing etchant, and simultaneously, the p-type InGaAsP etch stop layer 105 is used as a mask for etching the p-type InP cladding layer 104 with a hydrochloric acid containing etchant (see FIG. 9(d)). At this time, the side etching of the p-type InP over cladding layer 106 and the p-type InP cladding layer 104 is not carried out, so that the side face after the etching is substantially perpendicular to the n-type InP substrate 101.

Thereafter, after an $SiO_2$ film 108 is formed on the whole surface of the device, a resin 109 is filled in groove portions 114 on both sides of the ridge portion 113 to be flattened. Moreover, after a p-side ohmic electrode 110 of Pt/Ti/Pt is formed on the p-type InGaAs contact layer 107, a wire/bonding pad 111 of Ti/Pt/Au is formed. Finally, an n-side ohmic electrode 112 of AuGe/Ni/Au is formed on the reverse surface of the n-type InP substrate 101, so that the ridge waveguide type semiconductor laser of FIG. 9(e) is completed.

In this embodiment, it is possible to very precisely the ridge shape only by the width of the opening portion 116 of the $SiO_2$ growth inhibiting mask 115 and the thickness of the respective layers selectively grown on the opening portion 116. The side face of the selective growth layer comprises the (111)B crystal plane 117, and has an angle of 54° with respect to then-type InP substrate 101. Therefore, if the width of the opening portion 116 is 5.0 µm, the width of the p-type InGaAsP etch stop layer 105 is 4.7 µm, and the width of the p-type InGaAs contact layer 107 is 2.7 µm. Moreover, since the side etching does not occur during the etching of the InP layer with the hydrochloric acid containing etchant and since the side face after the etching is substantially perpendicular to the n-type InP substrate 101, the p-type InP cladding layer 104 and the p-type InP over cladding layer 106 can be controlled to be formed so as to substantially have the same widths as those of the p-type InGaAsP etch stop layer 105 and the p-type InGaAs contact layer 107, respectively.

In addition, the p-type InP cladding layer 104 is formed so as to be wider than the p-type InP over cladding layer 106 by 1.0 μm on each side, and the width of the p-type InP cladding layer 104 is substantially coincident with a distance of a photoelectric field distributed outside of the ridge portion 113. That is, the p-type InP cladding layer 104 is formed by a distance required for ensuring the light confining effect in vertical directions, and the increase of the parasitic capacity is suppressed to the necessary minimum. The stripe capacity in a device having a resonator length of 300 μm is about 0.5 pF, and the capacity of the whole device including the capacity (about 0.2 pF) of the electrode pad portion is a small capacity of about 0.7 pF. The cut-off frequency determined by the series resistance of the device (about 7Ω) and the capacity of the device is a high frequency of about 30 GHz, and the device could cope with a rapid modulation exceeding 20 Gb/s.

In the ridge waveguide type photo semiconductor device, the photoelectric field distribution is determined by the neck width of the ridge portion 113.

According to this embodiment, the ridge shape can be very precisely controlled by the width of the opening portion 116 and the thickness of the respective selective growth layer. Therefore, the controllability of the photoelectric field distribution, mode refractive index and oscillation wavelength is very excellent. In particular, the wavelength division multiplex transmission system, it is required to arrange a large number of devices having different oscillation wavelengths and it is required to precisely control the oscillation wavelength of each device. According to this embodiment providing the excellent controllability of oscillation wavelength, a photo semiconductor device required for a wavelength multiplex transmission system can be provided at low costs.

(Fourth Embodiment)

Figure 10:
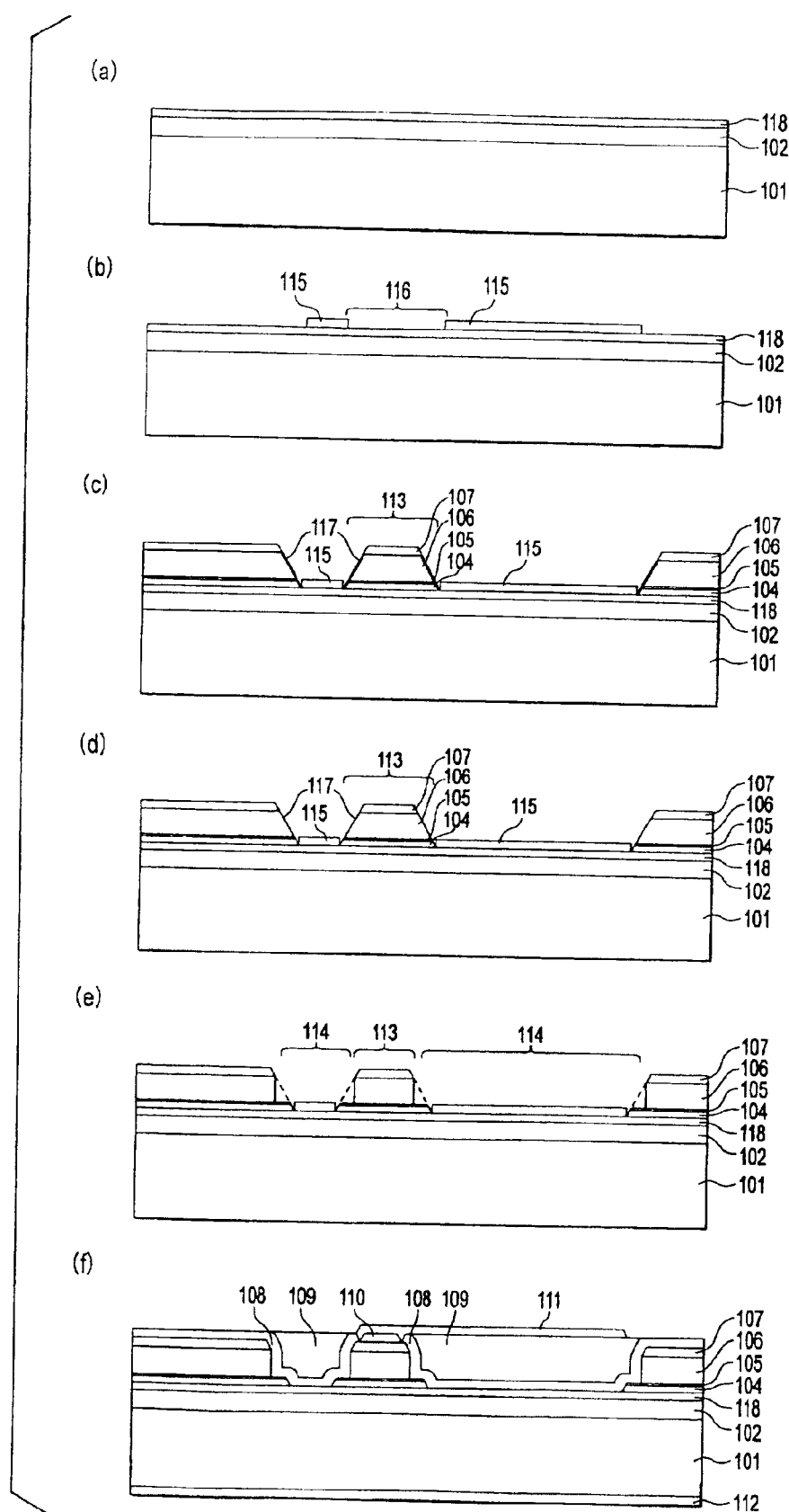
FIGS. 10(a) through 10(f) are sectional views showing the fourth embodiment of a method for fabricating a ridge waveguide type semiconductor laser according to the present invention.

Referring to FIG. 10, the fourth embodiment of the present invention will be described below. In this embodiment, a ridge waveguide type electric field absorbing light modulator is provided, and fabricating steps thereof are shown in FIG. 10. In FIG. 10, the same reference numbers as those in FIG. 9 are given to the same portions as those in FIG. 9, and the descriptions thereof are omitted.

First, on an n-type InP substrate 101 having a principal plane of (100) plane, an n-type InP cladding layer 102 and an optical absorbing layer 118 having an InGaAsP/InGaAsP multiple quantum well structure are sequentially stacked (see FIG. 10(a)).

Then, on the multiple quantum well optical absorbing layer 118, an SiO$_2$ growth inhibiting mask 115 having a stripe-shaped opening portion 116 (width 5.0 μm) is formed in the <110> direction (see FIG. 10(b)). Moreover, a p-type InP cladding layer 104 having a thickness of 0.2 μm, a p-type InGaAsP etch stop layer 105 having a thickness of 0.02 μm, a p-type InP over cladding layer 106 having a thickness of 1.4 μm, and a p-type InGaAs contact layer 107 having a thickness of 0.3 μm, are selectively grown on the opening portion 116 by the metal organic chemical vapor deposition (MOCVD) method (see FIG. 10(c)). At this time, the side face of the selective growth layer is formed from the (111)B crystal plane 117, and the shape of the cross section of the ridge portion 113 is trapezoid. Although the growth rate of the (111)B plane is far lower than that of the (100) plane, there are some cases where the p-type InP over cladding layer 106 and the p-type InGaAs contact layer 107 are slightly grown on the side face of the ridge portion 113 as shown in FIG. 10(c).

Therefore, the p-type InGaAs contact layer 107 on the side face of the ridge portion 113 is etched with a sulfuric acid containing etchant (see FIG. 10(d)). Since the p-type InGaAs contact layer 107 on the side face of the ridge portion 113 has a very small thickness of about 0.01 μm, the p-type InGaAs contact layer 107 on the side face of the ridge portion 113 could be etched while hardly changing the shape of the InGaAs contact layer 107 on the top portion of the ridge portion 113.

Thereafter, the p-type InGaAs contact layer 107 is used as a mask for etching the p-type InP over cladding layer 106 with a hydrochloric acid containing etchant (see FIG. 10(e)). Moreover, an electrode forming process is carried out to complete an electric field absorbing light modulator having a ridge waveguide structure shown in FIG. 10(f).

Also in this embodiment similar to the third embodiment, it is possible to very precisely the ridge shape only by the width of the opening portion 116 of the SiO$_2$ growth inhibiting mask 115 and the thickness of the respective layers selectively grown on the opening portion 116.

In this embodiment, the growth inhibiting mask 115 on one side of the opening portion 116 was widely formed. Groove portions 114 corresponding to portions provided with the growth inhibiting mask 115 were filled with a resin 109 to be flattened. Moreover, by providing a bonding pad 111 on the resin 109, the capacity of the electrode pad portion was reduced to 0.1 pF or less. The stripe capacity in a device having a resonator length of 200 μm is about 0.3 pF, and the capacity of the whole device including the capacity of the electrode pad portion is a small capacity of about 0.4 pF. The cut-off frequency determined by an external termination resistance (50Ω) and the capacity of the device is a high frequency of 15 GHz or higher, and the device could cope with a transmission system of 10 Gb/s.

(Fifth Embodiment)

Figure 11:
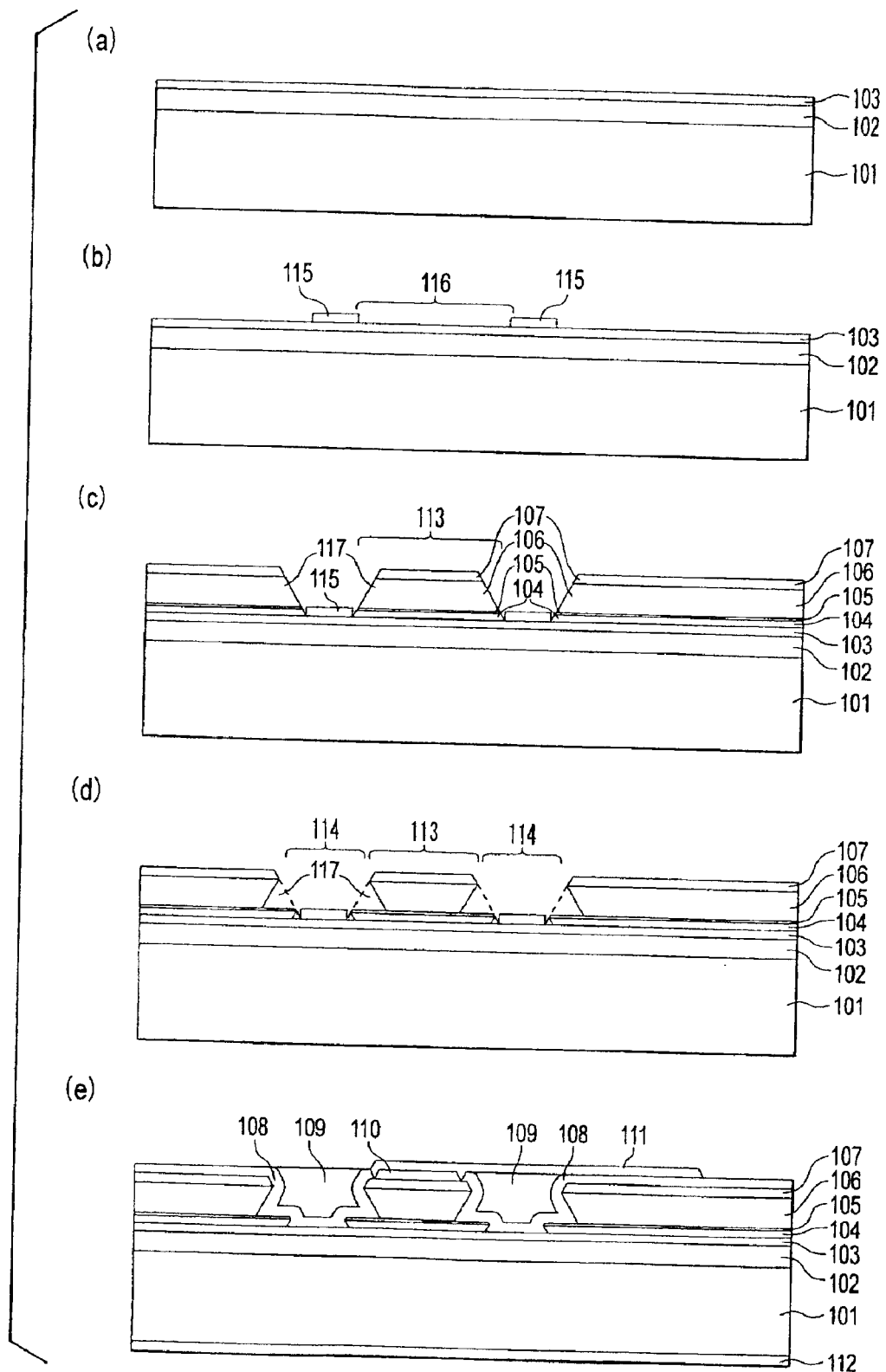
FIGS. 11(a) through 11(e) are sectional views showing the fifth embodiment of a method for fabricating a ridge waveguide type semiconductor laser according to the present invention.
Figure 12:
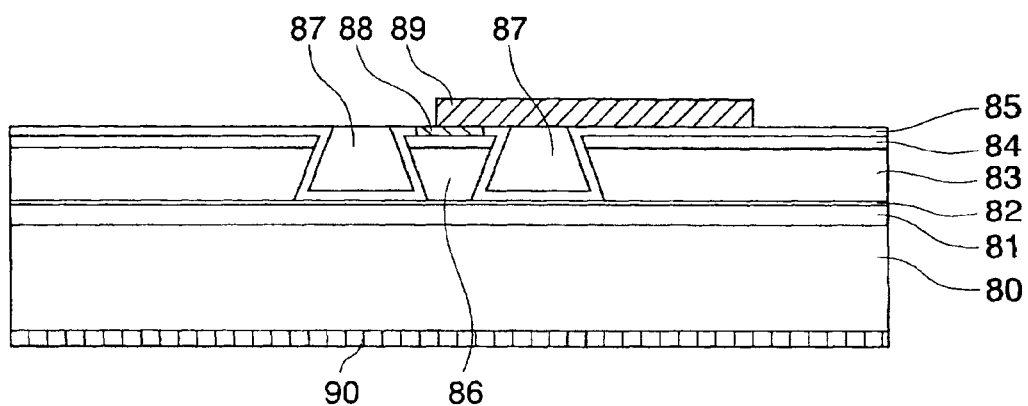
FIG. 12 is a sectional view showing the construction of a conventional Fabry-Perot ridge waveguide type semiconductor laser.
Figure 13:
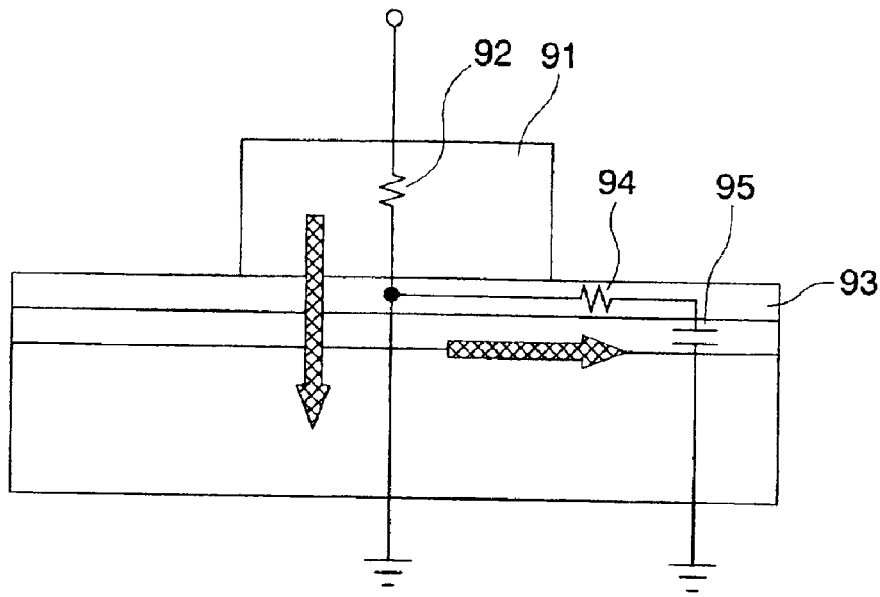
FIG. 13 is an equivalent circuit diagram of the Fabry-Perot ridge waveguide type semiconductor laser shown in FIG. 12.
Figure 14:
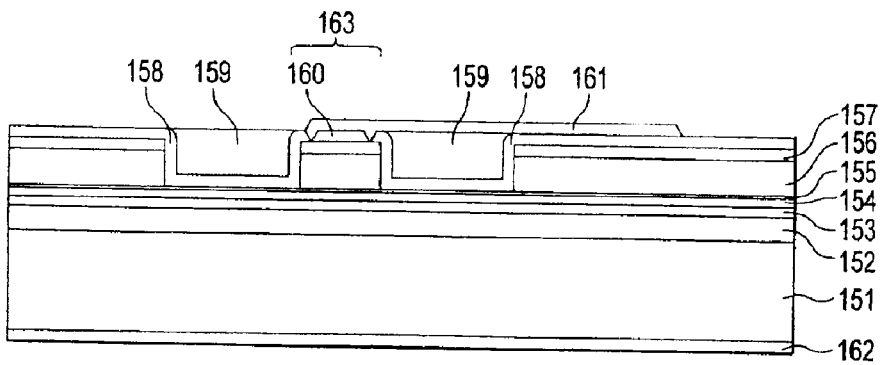
FIG. 14 is a sectional view showing the construction of another conventional ridge waveguide type semiconductor laser.
Figure 15:
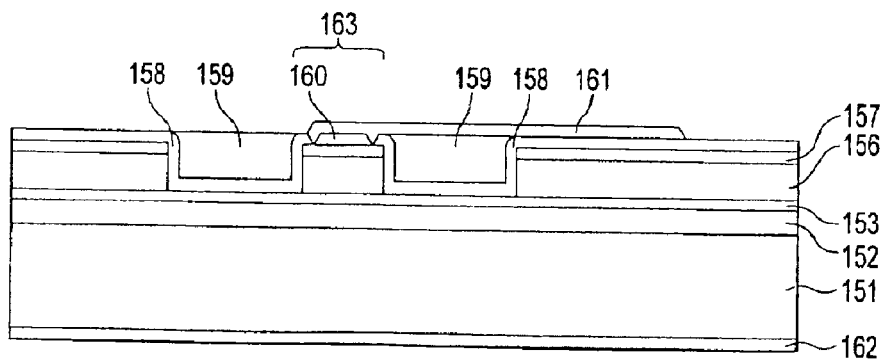
FIG. 15 is a sectional view showing the construction of a further conventional ridge waveguide type semiconductor laser.
Figure 16:
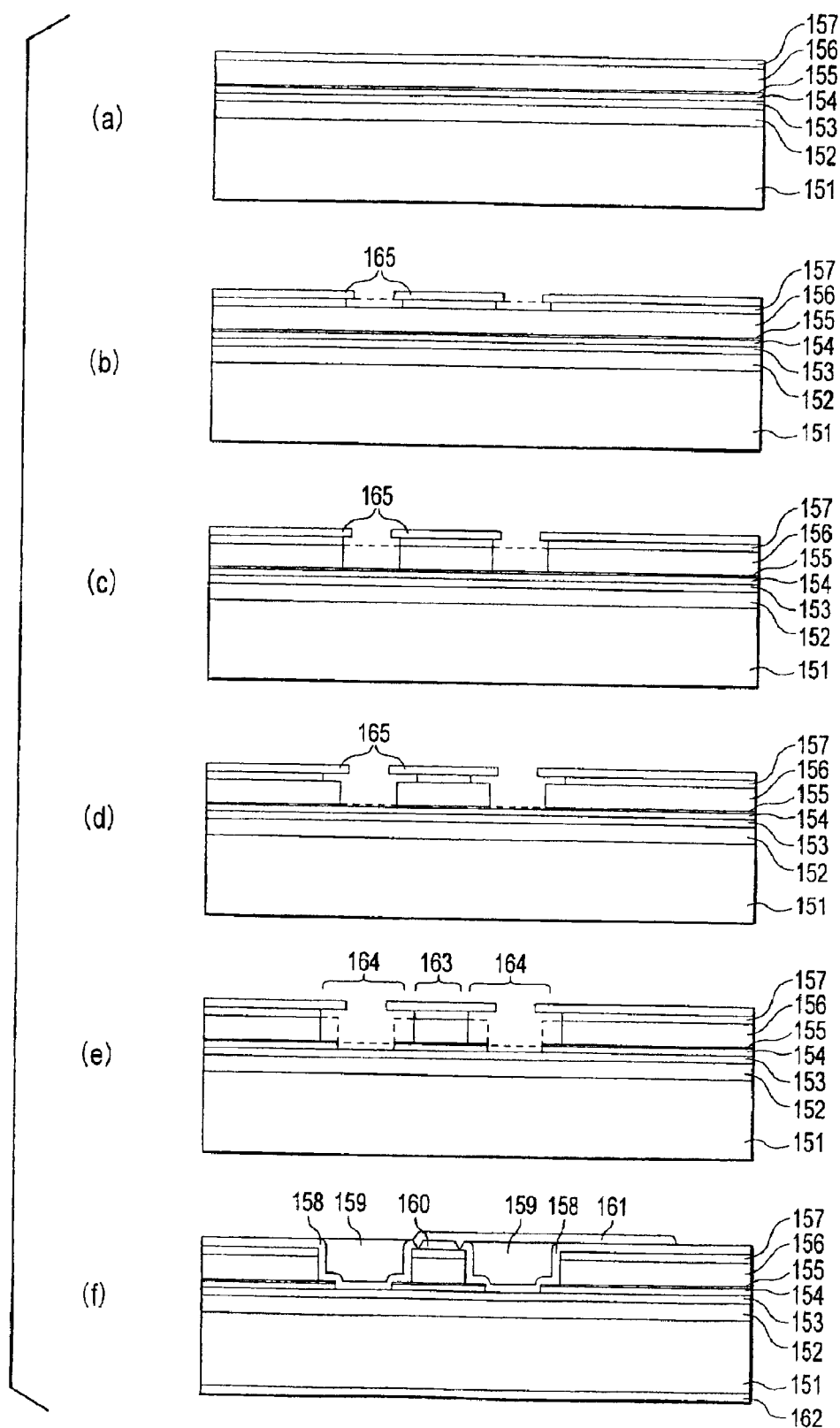
FIGS. 16(a) through 16(f) are sectional view showing the construction of a still further conventional ridge waveguide type semiconductor laser.

Referring to FIG. 11, the fifth embodiment of the present invention will be described below.

In this embodiment, a method for fabricating a ridge waveguide type semiconductor laser is provided, and fabricating steps thereof are shown in FIG. 11. In this figure, the same reference numbers as those in FIG. 9 are given to the same portions as those in FIG. 9, and the descriptions thereof are omitted.

First, on an n-type InP substrate 101 having a principal plane of (100) plane, an n-type InP cladding layer 102, and an active layer 103 having an InGaAsP/InGaAsP multiple quantum well structure are sequentially stacked (see FIG. 11(a)).

Then, on the active layer 103, an SiO$_2$ growth inhibiting mask 115 having a stripe-shaped opening portion 116 (width 7.0 μm) is formed in the <110> direction (see FIG. 11(b)).

Moreover, a p-type InP cladding layer 104 having a thickness of 0.2 μm, a p-type InGaAsP etch stop layer 105 having a thickness of 0.02 μm, a p-type InP over cladding layer 106 having a thickness of 1.4 μm, and a p-type InGaAs contact layer 107 having a thickness of 0.3 μm are selectively grown on the opening portion 116 by the metal organic chemical vapor deposition(MOCVD) method (see FIG. 11(c)). At this time, the side face of the selective growth layer is formed from the (111)B crystal plane 117, and the shape of the cross section of the ridge portion 113 is trapezoid.

Then, the p-type InGaAs contact layer 107 is used as a mask for etching the p-type InP over cladding layer 106 with a hydrogen bromide containing etchant, and simultaneously, the p-type InGaAsP etch stop layer 105 is used as a mask for etching the p-type InP cladding layer 104 with a hydrogen bromide containing etchant (see FIG. 11(d)). At this time, the side etching of the p-type InP over cladding layer 106 and the p-type InP cladding layer 104 is not carried out, so that the side face after the etching is a (111)A crystal plane 119.

Thereafter, an electrode forming process is carried out to complete a ridge waveguide type semiconductor laser shown in FIG. 11(e).

In this embodiment, the hydrogen bromide containing etchant is used for etching the p-type InP over cladding layer 106 and the p-type InP cladding layer 104, so that the side face after the etching comprises the (111)A crystal plane 119 and has an angle of 54° with respect to the n-type InP substrate 101. As a result, the ridge portion 113 after the etching has a reverse mesa shape. Also in this case similar to the third embodiment, it is possible to very precisely the ridge shape only by the width of the opening portion 116 of the $SiO_2$ growth inhibiting mask 115 and the thickness of the respective layers selectively grown on the opening portion 116. If the width of the opening portion 116 is set to be 7.0 $\mu$m, the width of the p-type InGaAsP etch stop layer 105 is 6.7 $\mu$m, and the width of the p-type InGaAs contact layer 107 is 4.7 $\mu$m. Moreover, after the etching with the hydrogen bromide containing etchant, the p-type InP over cladding layer 106 and the p-type InP cladding layer 104 can be formed so as to have neck widths of 6.4 $\mu$m and 2.6 $\mu$m, respectively. The p-type InP cladding layer 104 is formed so as to be wider than the p-type InP over cladding layer 106 by 1.9 $\mu$m on each side, and the parasitic capacity is slightly larger than that in the third embodiment. However, in this embodiment, since the p-type InP over cladding layer 106 has a reverse mesa shape, the p-type InGaAs contact layer 107 can be widely formed. That is, the device series resistance can be reduced by increasing the area of the p-side ohmic electrode 110. Although the stripe capacity in a device having a resonator length of 300 $\mu$m is about 0.7 pF which is slightly larger than that in the third embodiment, the capacity of the whole device including the capacity (about 0.2 pF) of the electrode pad portion is suppressed to be about 0.9 pF. On the other hand, the device series resistance is reduced to about 4$\Omega$, and a cut-off frequency of about 40 GHz was obtained as the cut-off frequency determined by the capacity of the device and the device series resistance.

Furthermore, the present invention should not be limited to the above described embodiments. While the InGaAsP/InP semiconductor devices have been described in the above described embodiments, the present invention may be applied to various materials, such as GaAlAs/GaAs and GaInNAs/GaAs.

While the present invention has been applied to the ridge waveguide type semiconductor laser and the electric field absorbing light modulator in the above described embodiments, the present invention may be applied to light switches, light amplifiers, waveguide type light receiving devices, and device structures obtained by integrating them. While the active layer and the light absorbing layer had have the multiple quantum well structure, these layers may be formed of bulk materials.

The conductive type of the semiconductor substrate should not be limited to n type, and a semiconductor substrate may have a crystal plane other than (100). The plane directon of the side face of the ridge portion after selective growth and/or etching should not be limited to the (111) crystal plane. A crystal plane suited to obtain a desired ridge portion may be utilized. The present invention can be modified and carried out in various ways without departing from the principle of the invention.

As described above, according to a ridge waveguide type photo semiconductor device and a method for fabrication the same according to the present invention, it is possible to prevent the occurrence of leakage current.

According to a method for fabricating a ridge waveguide type photo semiconductor device according to the present invention, it is possible to realize both of the reduction of capacity and the light confinement to an active layer and to obtain a desired ridge shape with a required precise.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A ridge waveguide type photo semiconductor device comprising:

a first cladding layer of a first conductivity type which is formed on a semiconductor substrate of the first conductivity type;

an active layer which is formed on said first cladding layer;

a second cladding layer of a second conductivity type which is formed on said active layer;

a third cladding layer of the second conductivity type which is formed on said second cladding layer and which is worked so as to have a ridge shape; and an impurity diffusion region which is formed in said second cladding layer and said active layer on both sides of said ridge-shaped third cladding layer and which has a higher resistance value than that of said second cladding layer below said ridge shape, said impurity diffusion region being a region into which proton ions are implanted and which prevents a current injected into the active layer from diffusing to both sides of said ridge-shaped third cladding layer.

2. A ridge waveguide type photo semiconductor device as set forth in claim 1, wherein said semiconductor substrate is made of InP or GaAs.

3. A ridge waveguide type photo semiconductor device as set forth in claim 1, wherein said ridge shape of said third cladding layer is a reverse mesa shape.

4. A method for fabricating a ridge waveguide type photo semiconductor device, said method comprising:

sequentially crystal-growing and forming a first cladding layer of a first conductivity type, an active layer, a second cladding layer of a second conductivity type, a third cladding layer of the second conductivity type, and a contact layer, on a semiconductor substrate of the first conductivity type;

forming a mask having a stripe shape on said contact layer;

etching said contact layer and said third cladding layer with said mask so that said contact layer and said third cladding layer have a reverse mesa-shaped cross section, to form a ridge portion; and subsequently implanting proton ions into said second cladding layer and said active layer on both sides of said ridge-shaped third cladding layer to form an impurity diffusion region.

5. A method for fabricating a ridge waveguide type photo semiconductor device, said method comprising:

growing at least an optical waveguide layer on a semiconductor substrate of a first conductivity type;

forming a growth inhibiting mask having an opening portion on said optical waveguide layer;

sequentially growing a ridge portion on said opening portion, said ridge portion comprising at least a first cladding layer of a second conductivity type, an etch stop layer, a second cladding layer of the second conductivity type, and a contact layer of the second conductivity type; and etching said second cladding layer with said contact layer as a mask.

6. A method for fabricating a ridge waveguide type photo semiconductor device as set forth in claim 5, wherein said contact layer is formed by the metal organic chemical vapor deposition method, and wherein said method for fabricating the ridge waveguide type photo semiconductor device further comprises etching and removing said contact layer of the second conductivity type having grown on the side face of said ridge portion by the metal organic chemical vapor deposition method, before the etching of the second cladding layer.

7. A method for fabricating a ridge waveguide type photo semiconductor device as set forth in claim 5, wherein said second cladding layer has the form of a mesa shape with respect to said semiconductor substrate before the etching.

8. A method for fabricating a ridge waveguide type photo semiconductor device as set forth in claim 5, wherein the principal plane of said semiconductor substrate is (100) plane, and said opening portion has a stripe shape extending in <110> direction, the side face of said over cladding layer before the etching being (111)B plane.

9. A method for fabricating a ridge waveguide type photo semiconductor device as set forth in claim 5, wherein the said second cladding layer has the form of a reverse mesa shape with respect to said semiconductor substrate after the etching.

10. A ridge waveguide type photo semiconductor device comprising:
 a first cladding layer of a first conductivity type which is formed on a semiconductor substrate of the first conductivity type;
 an active layer which is formed on said first cladding layer;
 a second cladding layer of a second conductivity type which is formed on said active layer;
 a third cladding layer of the second conductivity type which is formed on said second cladding layer and which is worked so as to have a ridge shape; and
 a proton implanted region which proton ions are implanted in said second cladding layer and said active layer on both sides of said ridge-shaped third cladding layer.

11. A ridge waveguide type photo semiconductor device as set forth in claim 10, wherein said ridge shape of said third cladding layer is a reverse mesa shape.

* * * * *